United States Patent [19]

Jin

[11] Patent Number: 5,975,922
[45] Date of Patent: Nov. 2, 1999

[54] DEVICE CONTAINING DIRECTIONALLY CONDUCTIVE COMPOSITE MEDIUM

[75] Inventor: Sungho Jin, Millington, N.J.

[73] Assignee: Lucent Technologies Inc., Murray Hill, N.J.

[21] Appl. No.: 09/036,902

[22] Filed: Mar. 9, 1998

[51] Int. Cl.⁶ .................................................. H01R 4/58
[52] U.S. Cl. .............................................. 439/91; 439/61
[58] Field of Search ................................ 439/66, 91, 591

[56] References Cited

U.S. PATENT DOCUMENTS

| | | | |
|---|---|---|---|
| 4,118,102 | 10/1978 | Kuist et al. | 339/17 |
| 4,644,101 | 2/1987 | Jin et al. | 178/18 |
| 4,737,112 | 4/1988 | Jin et al. | 439/66 |
| 5,045,249 | 9/1991 | Jin et al. | 264/24 |
| 5,213,715 | 5/1993 | Patterson et al. | 252/518 |
| 5,216,807 | 6/1993 | Yoshizawn et al. | 29/876 |
| 5,509,815 | 4/1996 | Jin et al. | 439/91 |
| 5,522,962 | 6/1996 | Koskenmaki et al. | 156/272.4 |
| 5,624,268 | 4/1997 | Maeda et al. | 439/66 |
| 5,805,425 | 9/1998 | Peterson | 361/769 |
| 5,819,406 | 11/1998 | Yoshizawn et al. | 29/877 |
| 5,837,119 | 11/1998 | Kang et al. | 205/74 |

OTHER PUBLICATIONS

"New Z–Direction Anisotropically Conductive Composites", by Jin, S. et al., *J. Applied Aphysics*, 64 (10), pp. 6008–6010 (Nov. 15, 1988).

"Optically Transparent, Electrically Conductive Composite Medium", by Jin, S. et al., *American Assoc. for the Advancement of Science*, vol. 255, pp. 446–448 (Jan. 24, 1992).

*Primary Examiner*—Steven L. Stephan
*Assistant Examiner*—Chandrika Prasad
*Attorney, Agent, or Firm*—Scott J. Rittman

[57] ABSTRACT

A device having a composite interconnection medium that reduces or avoids long-term reliability problems exhibited by current media, containing a first component and a second component, e.g., circuit boards, and an intermediate area between the first component and the second component. The intermediate area contains electrically conductive particles in a non-conductive matrix and compression-limiting bodies that are either located within the matrix or separately attached to one of the components. The conductive particles are arranged in chains of two or more particles across the thickness of the matrix to provide electrical connection between the first component and second component. The compression-limiting bodies substantially reduce the likelihood that dimensional changes in the components, e.g., due to warping or servicing, will stress or deform the matrix to an extent that unacceptably affects the electrical conductivity through the intermediate area.

15 Claims, 3 Drawing Sheets

1

DEVICE CONTAINING DIRECTIONALLY CONDUCTIVE COMPOSITE MEDIUM

BACKGROUND OF THE INVENTION

1. Field of the Invention

The invention relates to electrical connections, in particular the use of composite materials to make such connections.

2. Discussion of the Related Art

Recently, there has been a desire to find alternatives for the traditional soldering methods of making electrical connections. This desire has arisen from the need to simplify large-scale commercial processes, as well as to provide temporary, but reliable, electrical contacts, such as used for testing purposes. Several alternatives have been found in the area of composite materials. Some composite materials have utilized wire segments in a non-conductive matrix. Other composite materials have utilized spherical particles, held in a non-conductive matrix, as a bridge between adjacent electrical contacts. See, e.g., U.S. Pat. No. 4,737,112.

Additional composite interconnection media have been developed in sheet form, with the sheets exhibiting anisotropic, z-direction electrical conductivity (where the z-direction is across the thickness of the sheet and the x- and y-directions are in the plane of the sheet.) See, e.g., U.S. Pat. Nos. 5,522,962, 5,045,249, and 4,118,102, the disclosures of which are hereby incorporated by reference, Jin et al., "New, z-direction anisotropically conductive composites," *J. Appl. Phys.*, Vol. 64, No. 10, 1988, and Jin et al., "Optically Transparent, Electrically Conductive Composite Medium," *Science*, Vol. 255, 1992. The anisotropic conductivity is provided by individual chains of electrically conductive particles reaching across the thickness of the sheet, as illustrated in FIG. 1. The conductive particles 100 are typically magnetic and therefore capable of being aligned in z-direction chains by application of a magnetic field during the curing of a matrix material 102. The matrix 102 is generally an elastomeric material, which makes it possible to compress the sheet between two electrical components 104, 106 such that a desired electrical connection is made between contact pads 108, 110 of the components.

The long-term reliability of these composite interconnection media has been a concern, however, and improved media which address this concern are desired.

SUMMARY OF THE INVENTION

The invention provides a device having a composite interconnection medium that reduces or avoids long-term reliability problems exhibited by current media. Specifically, the device of the invention contains a first component and a second component, e.g., circuit boards, and an intermediate area between the first component and the second component. The intermediate area contains electrically conductive particles in a non-conductive matrix and compression-limiting bodies that are either located within the matrix or separately attached to one of the components. The particles are arranged in chains of two or more particles across the thickness of the matrix to provide anisotropic, z-direction electrical connection between the first component and second component. The compression-limiting bodies substantially reduce the likelihood that dimensional changes in the components, e.g., due to warping or servicing, will stress or deform the matrix to an extent that unacceptably affects the electrical conductivity through the intermediate area.

It was found that previous anisotropic composite interconnection media experienced large variations in electrical conductivity based on the compressive stress applied. See, e.g., FIG. 2, which shows the resistance vs. pressure and deformation for a 18 mil thick sheet of a silicone elastomer matrix (General Electric RTV No. 615) containing 5 vol. % 20 $\mu$m diameter nickel particles coated with 1000 Å gold, formed according to the process discussed in U.S. Pat. No. 5,045,249, referenced previously. The figure clearly illustrates the substantial variation in resistance caused by, in some cases, a relatively small change in pressure and deformation. Localized warping and stresses are therefore capable of substantially affecting the electrical connectivity in a device utilizing such composite interconnection media. The invention, however, provides a device in which such an effect is reduced or avoided.

Specifically, as reflected in FIGS. 3A and 3B, the compression-limiting bodies 24, which typically have a relatively high tensile strength of at least 500 psi (pounds per square inch), typically 2000 to 10,000 psi, control the deformation of the medium 20 containing the conductive particles 22. To provide this deformation control, the compression-limiting bodies, when present in the medium 20, typically have a maximum dimension about 50 to about 90% of the thickness of the matrix (as measured in the absence of compressive stress), more advantageously about 60 to about 80%. A tight size distribution of the bodies is desired to provide consistent deformation control throughout the device. In addition, to reduce interference with the electrical conduction across the electrically conductive particles, the compression-limiting bodies, when located within the matrix, are generally included in an amount of about 0.1 to about 5 vol. %, advantageously about 0.2 to about 2 vol. %. It is also possible for the compression-limiting bodies to be located outside the matrix, e.g., temporarily or permanently attached to one of the components, as reflected in FIGS. 4 and 5.

By controlling the effect of stresses and deformation on a composite interconnection medium, the invention provides a device having increased long-term reliability.

DETAILED DESCRIPTION OF THE INVENTION

Figure 3A:
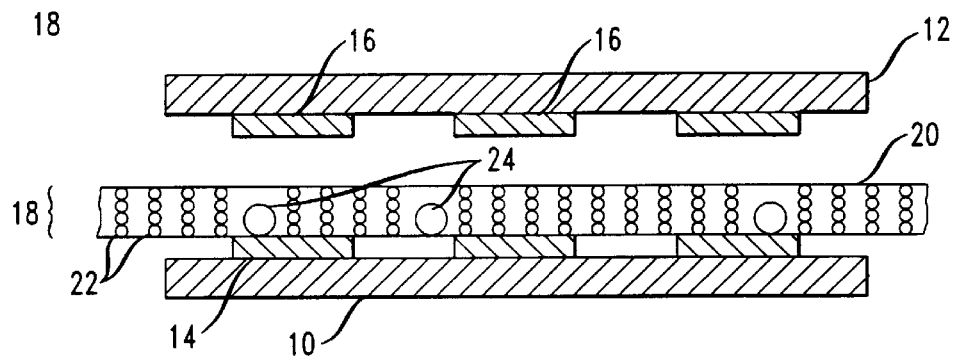
FIGS. 3A and 3B illustrate one embodiment of a device of the invention.
Figure 3B:
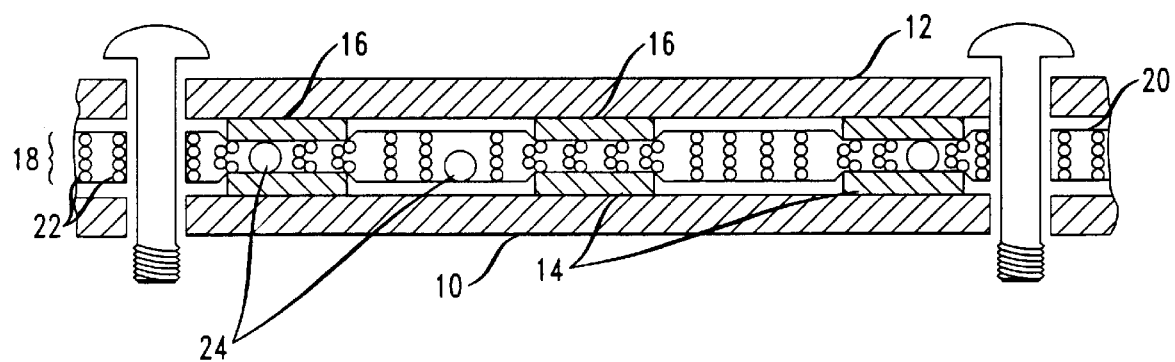

In one embodiment, reflected in FIGS. 3A and 3B, the device of the invention contains a first electrical component 10 and a second electrical component 12, e.g., circuit boards, each component 10, 12 having electrical contact pads 14, 16. An intermediate area 18 between the components contains a composite interconnection medium 20 that provides electrical contact between the two components. The medium 20 is formed from a non-conductive matrix and electrically conductive particles 22. The particles 22 are aligned in chains of at least two particles 22 across the thickness of the matrix, thereby providing anisotropic, z-direction conductivity. The intermediate area 18 between the components also contains compression-limiting bodies 24. In the embodiment of FIG. 3A and 3B, the compression-limiting bodies are located within the medium 20.

Figure 1:
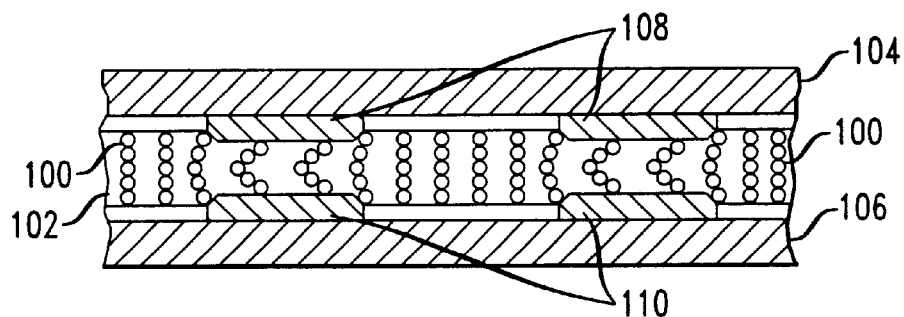
FIG. 1 illustrates a prior art composite interconnection medium.
Figure 2:
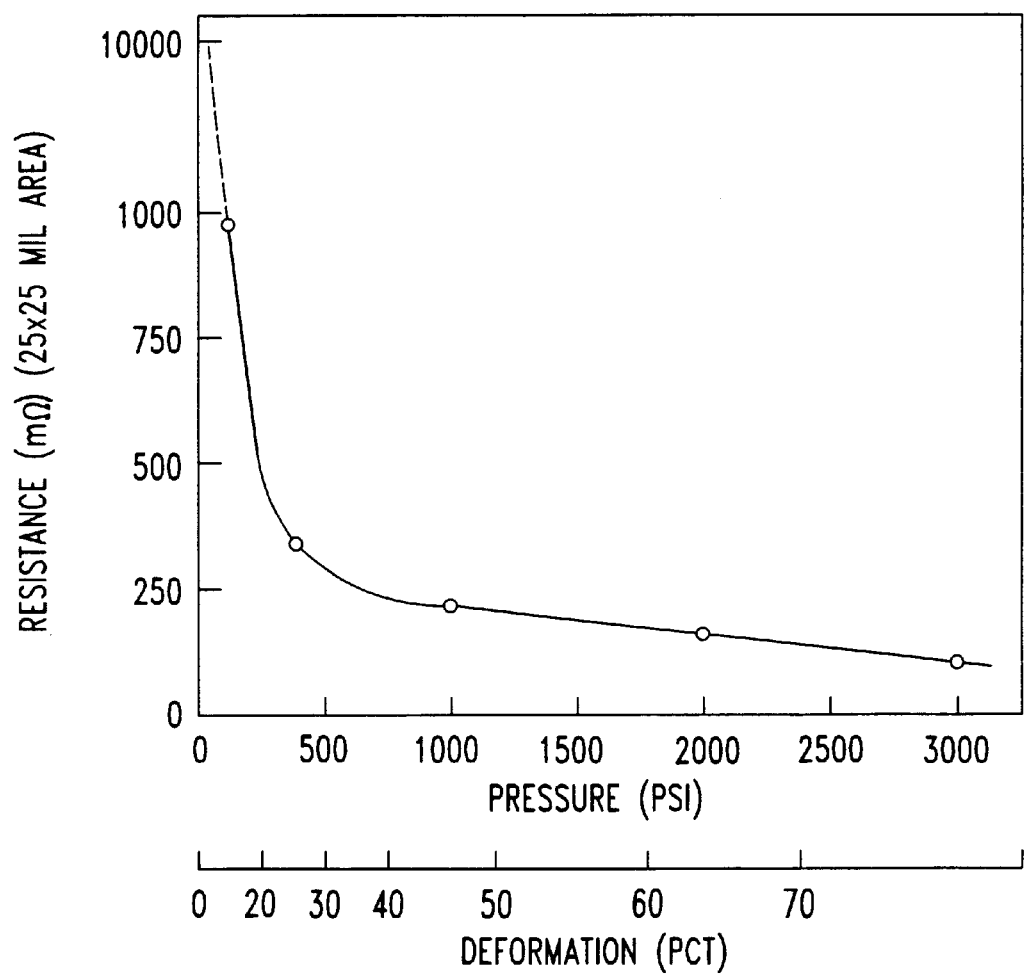
FIG. 2 illustrates the effect of stress and deformation on resistivity in a prior art composite interconnection medium.

As shown in FIG. 3B, when the first and second components 10, 12, and medium 20 are clamped together, the chains of particles 22 provide conductivity between the contact pads 14, 16 of the components 10, 12. The compression-limiting bodies, however, limit the extent of deformation which the medium 20 will undergo. This limit in deformation is significant because, as shown in FIG. 2, high levels of deformation lead to substantially reduced resistance in the medium, increasing the chances of short circuits, open circuits, or reduced conductivity. Specifically, under high deformation, the chains of conductive particles are no longer arranged primarily in the z-direction, but are instead partially, and uncontrollably, re-arranged in the x- and y-directions, thereby reducing the anisotropic characteristics of the medium.

Figure 4:
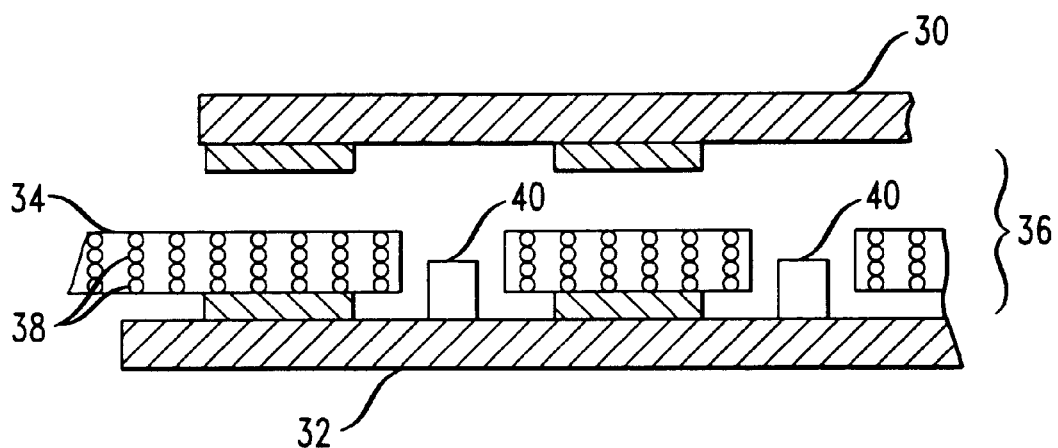
FIG. 4 illustrates another embodiment of a device of the invention.
Figure 5:
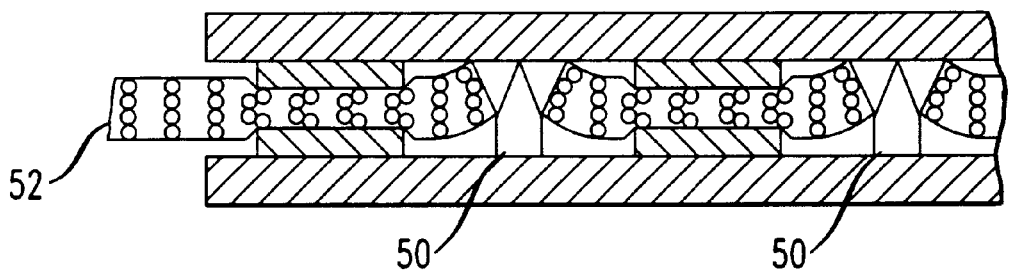
FIG. 5 illustrates a further embodiment of a device of the invention.

In another embodiment, the compression-limiting bodies are located outside a matrix containing electrically conductive particles. For example, as shown in FIG. 4, two components 30, 32 are electrically connected by a medium 34, the medium formed from a non-conductive matrix and electrically conductive particles 38. The intermediate area 36 between the components 30, 32 contains compression-limiting bodies 40 that are located outside the medium 34. In this embodiment, the bodies 40 are typically attached, temporarily or permanently, to one of the components 30, 32, and the medium 34 is then generally provided with holes through which the bodies 40 fit during device formation. In another embodiment, reflected in FIG. 5, compression-limiting bodies 50 are also located outside a composite interconnection medium 52, and the bodies 50 are provided with a sharp point capable of substantially punching through the medium 52, such that holes do not have to be formed in the medium 52 prior to device formation.

To provide the deformation-control function, the compression-limiting bodies typically exhibit a tensile strength of at least 500 psi, generally 2000 to 10,000 psi. The bodies are typically formed from plastics, ceramics (including glass), or metal particles coated with electrically insulating plastic or ceramic. When located in an interconnection medium, the bodies are generally spherical, cylindrical, or disk-shaped, but it is also possible to use other shapes. When located outside an interconnection medium, the compression-limiting bodies are generally provided with a shape that promotes temporary or permanent attachment to an electrical component, as reflected in FIGS. 4 and 5. The maximum dimension (i.e., the longest distance across a body) of bodies that are located in an interconnection medium are typically 50 to 90% of the average thickness of the medium (as measured in the absence of compressive stress), advantageously 60 to 80%. For bodies located outside a medium, the dimension in the z-direction is typically no more than 90% of the combined thickness of two opposing contact pads plus the medium. Advantageously, for such bodies located outside a medium, the dimension in the z-direction is selected such that when two components are brought into contact with a composite medium, the medium is compressed between opposing contact pads to 50 to 90% of its initial thickness, more advantageously 60 to 80%. The maximum dimension in both embodiments typically ranges from 1 to 1000 mils. When compression-limiting bodies are located in an interconnection medium, the bodies are typically present in an amount of 0.1 to 5 vol. %, advantageously 0.2 to 2 vol. %. The variation in size of compression-limiting particles in a device is advantageously maintained at no more than 20% variation from the average, more advantageously no more than 10% variation from the average size, for purposes of maintaining consistency throughout the device.

The electrically conductive particles are typically formed from magnetic materials, e.g., iron, nickel, cobalt, or alloys thereof, or a ferrite material. It is also possible for the particles to be coated with gold or silver, or alloys thereof. Generally, the particles are spherical, and range in diameter from 0.1 to 500 $\mu$m, advantageously 1 to 200 $\mu$m. The concentration of the conductive particles in a medium is typically 0.1 to 40 vol. %, advantageously 0.5 to 20 vol. %. The matrix of a composite interconnection medium is typically formed from a polymeric material having elastomeric properties, e.g., rubber, silicone, or epoxy. (Elastomeric, for purposes of the invention, indicates rubber-like mechanical behavior.) It is also possible to use elastomeric materials exhibiting adhesive properties.

Interconnection medium suitable for the invention are capable of being prepared in a variety of ways. Typically, magnetic, electrically conductive particles and the compression-limiting bodies are mixed with a liquid matrix precursor. The mixture is then spread into a sheet, e.g., using a doctor blade. A magnetic field is applied to the sheet to align the conductive particles in z-direction chains. The mixture is then cured, e.g., by heat or ultraviolet light, depending on the particular matrix precursor, such that the particles remain aligned in such chains and the compression-limiting bodies are distributed throughout. The cured sheet is then ready for use. It is also possible to first mix the conductive particles and matrix precursor, spread the mixture onto a sheet, and then add the compression-limiting bodies to the sheet, e.g., by dropping or spraying. In addition, it is possible to first place compression-limiting bodies onto a tacky surface (or coat the bodies with a tacky material and then place them onto a surface), and then spread matrix precursor/conductive particle mixture onto the surface. These alternatives tend to provide more control over distribution of the bodies than processes in which the bodies are initially mixed with matrix precursor.

Magnetic field strengths suitable for aligning the conductive particles vary depending on factors such as matrix thickness, the matrix precursor viscosity, the size of the particles, and the concentration of the particles. Field strengths generally range from 100 to 2000 Oe, more typically 300 to 800 Oe. Direct current, alternating current, or a combination thereof are capable of being applied to align the particles. A field that is too weak tends to produce chains too short to provide conduction across the medium, while a field that is too strong tends to create dendritic particle structure within the medium as well as excessive protrusion of particles from the medium. However, some protrusion of the electrically conductive particles from the surface of the interconnection medium is typically advantageous. (Protrusion indicates that a portion of the particle rises above the surface formed by the matrix material, whether that portion of the particle is initially partially or fully coated with matrix material or free of matrix material. Generally, a thin coating of matrix material is present on a protruding particle of a fabricated medium, and the coating is then punctured or torn away upon contact of the particle with a contact pad.) Typically, protrusion of about $\frac{1}{10}$ to about $\frac{1}{2}$ of the surface area of a particle is useful. Such protrusion enhances conductivity through the medium as well as reliability, because the particles have better contact with contact pads of a component than buried particles.

Protrusion is obtainable on one surface of a medium by applying the magnetic field to an uncured matrix precursor layer that has been spread onto a substrate but maintains a free upper surface, where the magnetic field strength is slightly in excess of the strength needed for a flush surface. It is possible to obtain protrusion on both surfaces of a medium by first coating a substrate with an easily penetrable, removable substance, e.g., grease or honey, and then depositing the mixture of matrix precursor, conductive particles, and optionally compression-limiting bodies onto the substrate. The magnetic field is applied and the matrix cured, as discussed previously, and, subsequent to cure, the substance applied to the substrate is removed, e.g., by use of a solvent. In addition, instead of the removable substance, it is possible to use a material that does not adhere to the matrix upon cure, e.g., wax or rubber, yet into which protrusion of particles is possible. Furthermore, to maintain a desired surface flatness of the non-protruding areas of the medium, it is possible to also place such a non-adhering material on the top surface of the matrix precursor mixture prior to cure. A control sample is easily used to determine appropriate conditions for a desired level of protrusion.

In addition to forming the medium as a free-standing material, it is possible to apply a matrix precursor mixture containing magnetic, electrically conductive particles, and optionally compression-limiting bodies, directly onto a first electrical component, and then cure the matrix in the presence of an electric field. A second electrical component is placed onto the matrix precursor mixture either before or after the cure is performed.

Other embodiments of the invention will be apparent to those skilled in the art from consideration of the specification and practice of the invention disclosed herein.

What is claimed is:

1. A device comprising:

a first component and a second component; and an intermediate area between the first component and the second component, the intermediate area comprising electrically conductive particles in a non-conductive matrix and compression-limiting bodies, wherein the compression-limiting bodies are disposed on the first component, on the second component, or in the non-conductive matrix, wherein the compression-limiting bodies are formed from plastics, ceramics, or metals coated with electrically insulating materials, and wherein the particles are arranged in chains of two or more particles across the thickness of the matrix, the chains capable of providing electrical connection between the first component and the second component.

2. The device of claim 1, wherein the compression-limiting bodies have a tensile strength of about 500 psi or higher.

3. The device of claim 1, wherein the matrix is an elastomeric polymer.

4. The device of claim 1, wherein about $1/10$ to about $1/2$ the surface area of the electrically conductive particles located at the surface of the matrix protrudes from the matrix.

5. The device of claim 1, wherein the compression-limiting bodies are disposed in the non-conductive matrix and have an average maximum dimension 50 to 90% of the average thickness of the matrix as measured in the absence of compressive stress.

6. The device of claim 5, wherein the bodies have an average maximum dimension 60 to 80% of the average thickness of the matrix as measured in the absence of compressive stress.

7. The device of claim 5, wherein the bodies are present in the matrix in an amount of 0.1 to 5 vol. %, based on the volume of the matrix material, conductive particles, and compression-limiting bodies.

8. The device of claim 1, wherein the compression-limiting bodies are attached to at least one of the first component and the second component.

9. The device of claim 8, wherein the first and second components have opposing contact pads, and wherein the compression-limiting bodies have an average maximum dimension of about 90% or less of the sum of the thicknesses of the opposing contact pads plus the thickness of the matrix as measured in the absence of compressive stress.

10. A process for forming a device, comprising the steps of:

placing an intermediate layer onto a first component, the intermediate layer comprising a non-conductive matrix that comprises electrically conductive particles and compression-limiting bodies; and placing a second component onto the intermediate layer, wherein the particles are arranged in chains of two or more particles across the thickness of the intermediate layer, the chains capable of providing electrical connection between the first component and second component.

11. The process of claim 10, wherein the compression-limiting bodies have a tensile strength of about 500 psi or higher.

12. The process of claim 11, wherein the compression-limiting bodies comprise at least one of plastics, ceramics, and metals coated with electrically insulating material.

13. The process of claim 10, wherein about $1/10$ to about $1/2$ the surface area of the electrically conductive particles located at the surface of the matrix protrudes from the matrix.

14. The process of claim 10, wherein the compression-limiting bodies have an average maximum dimension 50 to 90% of the average thickness of the matrix as measured in the absence of compressive stress.

15. The process of claim 14, wherein the bodies are present in the matrix in an amount of 0.1 to 5 vol. %, based on the volume of the matrix material, conductive particles, and compression-limiting bodies.

* * * * *